United States Patent
Aoki

[19]

[11] Patent Number: 5,834,691
[45] Date of Patent: Nov. 10, 1998

[54] LEAD FRAME, ITS USE IN THE FABRICATION OF RESIN-ENCAPSULATED SEMICONDUCTOR DEVICE

[75] Inventor: Kazumasa Aoki, Nara, Japan

[73] Assignee: Sharp Kabushiki Kaisha, Osaka, Japan

[21] Appl. No.: 586,224

[22] Filed: Jan. 16, 1996

[30] Foreign Application Priority Data

Jan. 19, 1995 [JP] Japan ................................ 7-006585
Nov. 13, 1995 [JP] Japan ................................ 7-294286

[51] Int. Cl.⁶ .................................................. H01L 23/02
[52] U.S. Cl. ........................ 174/52.4; 174/52.2; 257/670; 257/676
[58] Field of Search ................................ 257/667, 670, 257/671, 672, 676, 666; 174/52.4, 52.2

[56] References Cited

U.S. PATENT DOCUMENTS

| | | | |
|---|---|---|---|
| 4,527,185 | 7/1985 | Philofsky et al. | 357/70 |
| 4,829,362 | 5/1989 | Tran et al. | 357/70 |
| 4,862,245 | 8/1989 | Pashby et al. | 357/70 |
| 4,912,546 | 3/1990 | Fujita | 357/70 |
| 4,984,059 | 1/1991 | Kubota et al. | 357/68 |
| 5,162,895 | 11/1992 | Takahashi et al. | 257/670 |
| 5,283,466 | 2/1994 | Hayashi | 257/667 |
| 5,358,906 | 10/1994 | Lee | 437/217 |
| 5,479,050 | 12/1995 | Pritchard et al. | 257/670 |
| 5,491,360 | 2/1996 | Lin | 257/672 |
| 5,663,594 | 9/1997 | Kimura | 257/666 |

FOREIGN PATENT DOCUMENTS

| | | |
|---|---|---|
| 3-12781 | 2/1991 | Japan . |
| 4-1503 | 1/1992 | Japan . |

*Primary Examiner*—Bot L. Ledynh
*Assistant Examiner*—Hung V. Ngo
*Attorney, Agent, or Firm*—Nixon & Vanderhye PC

[57] ABSTRACT

A lead frame for use in the fabrication of a resin-encapsulated semiconductor device of an LOC structure includes a die pad for receiving a semiconductor chip thereon; a plurality of leads having end portions located along the periphery of the die pad; at least two support bars supporting the die pad; tie bars supporting the plurality of leads; and two frame selvages supporting the tie bars. The die pad, leads, support bars, tie, bars, and frame selvages are formed from a flexible metal sheet as one piece. At least one of the support bars is connected to one of the tie bars or connected to one of the frame selvages in a region adjacent a connection point between the one of the tie bars and the at least one of the frame selvages, the region excluding an orthogonal projection of the die pad.

11 Claims, 22 Drawing Sheets

(a)

(b)

(c)

(d)

(a)

(b)

LEAD FRAME, ITS USE IN THE FABRICATION OF RESIN-ENCAPSULATED SEMICONDUCTOR DEVICE

BACKGROUND OF THE INVENTION

1. Field of the Invention

The present invention relates to a lead frame, its use in the fabrication of a resin-encapsulated semiconductor device, a process for fabricating the semiconductor device, and a mold. More particularly, the invention relates to: a lead frame to be used for the fabrication of a resin-encapsulated semiconductor device of a lead-on-chip (LOC) structure; a resin-encapsulated semiconductor device obtained by fixing a semiconductor chip on a die pad of a lead frame, connecting electrodes formed on a surface of the semiconductor chip to leads of the lead frame through conductive wires and encapsulating the semiconductor chip, wires and leads with a resin; a process for fabricating the resin-encapsulated-semiconductor device; and a mold for use in the fabrication process.

2. Description of Related Art

A semiconductor chip formed with an integrated circuit is generally encapsulated with a plastic material into a semiconductor package for protection thereof from the outside environment and for easier handling thereof. A typical semiconductor package has a construction as shown in FIG. 30. The semiconductor package 31 has in a bottom portion thereof a die pad 36 on which a semiconductor chip 34 is fixedly placed. Terminals of the semiconductor chip 34 are connected to leads 32 with fine metal wires 33, which leads 32 extend to the outside of an encapsulating material 35.

In the semiconductor package 31, the die pad 36 is disposed on the same level as the leads 32 or slightly lower than the leads 32. Hence, the leads 32 do not overlap the semiconductor chip 34. Where the semiconductor chip 34 is to be encapsulated into a package of this type, the semiconductor chip 34 needs to be appropriately spaced from the leads 32, resulting in an increased package size. In addition, since ends of the leads 32 are located around the semiconductor chip 34, electrodes of the semiconductor chip 34 to be connected to the leads 32 need to be formed on the periphery of a top surface of the chip 34. This imposes a limitation on the arrangement of the electrodes in an electrical circuit design of the semiconductor chip 34.

To overcome these problems, various semiconductor packages have been proposed which eliminate the need of arranging the electrodes on the periphery of the semiconductor chip surface, reduce the planar area of a package by allowing the ends of the leads to overlap the semiconductor chip, and ensure a flexible design of the electrode arrangement. Such semiconductor packages, which allow for a flexible electrode arrangement, offer an advantage that the length of wiring of the circuit can be shortened, thereby ensuring faster operation of the circuit.

These semiconductor packages are classified into two types on the basis of the construction and fabrication method thereof. A semiconductor package of one type is disclosed in, for example, Japanese Examined Publication No. 4-1503 (1992) wherein a semiconductor chip 44 is mounted on a die pad 46 as shown in FIG. 31. A semiconductor package of the other type is disclosed in, for example, Japanese Examined Publication No. 3-12781 (1991) wherein a semiconductor chip 54 is fixed to end portions of leads 52 with adhesive tapes 57 at the periphery of a tip surface of the semiconductor chip 54 as shown in FIG. 32.

There will be described a fabrication process for the semiconductor package 41 of FIG. 31.

Components required for the fabrication of the semiconductor package 41 include a semiconductor chip 44, a pair of lead frames respectively having leads 42 and a die pad 46 made of a copper alloy or iron-nickel alloy, an adhesive for bonding the semiconductor chip 44, fine metal wires such as of gold, and an encapsulating material 45 such as a resin. One lead frame 47 has the leads 42 as shown in FIG. 33, while the other lead frame 48 has the die pad 46 as shown in FIG. 34. These lead frames 47 and 48 are joined into one piece during the semiconductor device fabrication process. In the lead frame 48, the die pad 46 is not coplanar with frame selvages 48a and cross bars 48b, but in a position lower than the selvages 48a by an amount substantially the same as the thickness of the semiconductor chip 44 by down-setting a support bar 49 in a fabrication step of the lead frame 48.

It is noted that such a lead frame with a die pad may have frame selvages and cross bars, or may have only a die pad with no frame selvage and cross bars. The lead frame having a die pad alone may have no frame selvage 48a and cross bars 48b but support bars 49, or have neither frame selvages 48a and cross bars 48b nor support bars 49 (see FIG. 34). With the former type, end portions of the support bars are joined to frame selvages of the lead frame having leads at predetermined positions for integration. With the latter type, a lead frame having support bars as well as leads is used, and the die pad is joined to end portions of the support bars for integration.

In the semiconductor device fabrication process using two kinds of lead frames 47 and 48, the semiconductor chip 44 is first fixed onto the die pad 46 of the lead frame 48 with a die bond adhesive such as an epoxy resin.

Then, the lead frame 47 having the leads 42 is overlaid on the lead frame 48 attached with the semiconductor chip 44 in a predetermined spatial relation. In this sate, the end portions of the leads 42 are positioned above a surface of the semiconductor chip 44 on which electrodes are arranged. To keep this spatial relation, these two lead frames 47 and 48 are fixed with each other by welding or the like. Where the lead frame only having a die pad is to be used, this lead frame is joined to the lead frame having leads in substantially the same manner as above, except that these lead frames are joined at different positions.

Thereafter, the electrodes of the semiconductor chip 44 are connected to the leads 42 with fine metal wires 43, and the resulting structure is subjected to resin encapsulation, plating of surfaces of the leads, marking, and trimming and forming of the leads 42. Thus, the semiconductor package 41 is completed.

In the case of the semiconductor package 41 shown in FIG. 31, the leads 42 must be disposed to overlap the semiconductor chip 44 during the fabrication process and, therefore, the lead frames 47 and 48 (respectively shown in FIGS. 33 and 34) are necessarily joined into one piece. This results in an increased fabrication cost in comparison with, for example, the semiconductor package 31 shown in FIG. 30, because the semiconductor package 41 requires an additional lead frame.

Further, the fabrication process using two kinds of lead frames 47 and 48 requires the steps of overlapping the two lead frames 47 and 48 so that the die pad 46 and the leads 42 are disposed in a predetermined spatial relation, and joining the lead frames 47 and 48. Therefore, the fabrication cost is increased.

Furthermore, where the lead frames 47 and 48 respectively shown in FIGS. 33 and 34 are to be joined into one piece, the semiconductor chip 44 cannot be inserted from the sides where the support bars 49 are present after the support bars are transformed. Thus, the side from which the semiconductor chip 44 is to be inserted is limited to the sides where the support bars 49 are absent.

Next, description will be given to a fabrication process for the semiconductor package 51 shown in FIG. 32.

Components required for the fabrication of the semiconductor package 51 include a semiconductor chip 54, a lead frame 47 without a die pad (shown in FIG. 33), an adhesive tape material including a polyimide tape base and an adhesive such as an epoxy resin on opposite sides of the tape base, fine metal wires 53, and an encapsulating material 55.

Adhesive tapes 57 obtained by press-cutting the adhesive tape material into predetermined configurations by means of a metal die are applied onto predetermined end portions of the leads 52 of the lead frame 47. This process may be performed during the production process for the lead frame 47.

The semiconductor chip 54 is then attached to the adhesive tapes 57 applied on the end portions of the leads 52 in a predetermined position. Thus, the semiconductor chip 54 is fixed to the leads 52 with the end portions of the leads 52 located on a top surface of the semiconductor chip 54 with intervention of the adhesive tape 57.

Thereafter, electrodes formed on the top surface of the semiconductor chip 54 are connected to the leads 52 with the fine metal wires 53, and the resulting structure is subjected to resin encapsulation, plating of surfaces of the leads 52, marking, and trimming and forming of the leads 52. Thus, the semiconductor package 51 is completed.

In the fabrication process for the semiconductor package 51 shown in FIG. 32, the semiconductor chip 54 is fixed to the end portions of the leads with intervention of the adhesive tape 57. The adhesive tape 57 is much more expensive than the die bond adhesive employed in the fabrication of the semiconductor package 31 shown in FIG. 30, because the adhesive tape material is comprised of a polyimide tape base and an adhesive such as epoxy resin applied on the both sides the tape base. This results in an increased fabrication cost.

Further, the fabrication process for the semiconductor package 51 of FIG. 32 includes the steps of press-cutting the adhesive tape material into the predetermined configurations by means of the metal die to obtain the adhesive tape 57, applying the adhesive tape 57 onto predetermined portions of the leads 52 by pressure and heat, bonding the leads 52 to the semiconductor chip 54 by pressing the end portions of the leads 52 against predetermined portions of the semiconductor chip 54 for several seconds while applying pressure and heat onto the adhesive tape 57. Thus, the fabrication of the semiconductor package 51 requires a much more complicated process and more process time than the fabrication of the semiconductor package 31 of FIG. 30, thereby increasing the fabrication cost.

In addition, the adhesive of the adhesive tape 57 has a glass transition temperature lower than that of the die bond adhesive and a poor heat resistance. Therefore, semiconductor packages using such adhesive tape are more liable to cause package crack during a reflow process for the mounting thereof on a substrate.

SUMMARY OF THE INVENTION

The present invention provides a lead frame for use in the fabrication of a resin-encapsulated semiconductor device of an LOC structure. The lead frame includes a die pad for mounting a semiconductor chip thereon; a plurality of leads having end portions located along the periphery of the die pad; at least two support bars supporting the die pad; tie bars supporting the plurality of leads; and two frame selvages supporting the tie bars. All of the die pad, leads, support bars, the bars and frame selvages are integrally formed from a flexible metal sheet as one piece. At least one of the support bars is connected to one of the tie bars or connected to one of the frame selvages in a region excluding an orthogonal projection of the die pad but adjacent a connection point between the one of the tie bars and the one of the frame selvages.

Also, the present invention provides an alternative lead frame for use in the fabrication of a resin-encapsulated semiconductor device of an LOC structure that includes a die pad for mounting a semiconductor chip thereon; a plurality of leads having end portions located along the periphery of the die pad; at least two support bars supporting the die pad; and two frame selvages supporting at least one support bar. The components are similarly all integrally formed from a flexible metal sheet as one piece, and the frame selvages each include a narrow portion facing opposite the die pad.

Further, the present invention provides a resin-encapsulated semiconductor device utilizing either of the aforesaid lead frames. The semiconductor device includes a semiconductor chip disposed on a die pad and having a plurality of terminals formed on a surface thereof; fine metal wires connecting the plurality of terminals of the ,semiconductor chip to the corresponding leads; and a resin encapsulant encapsulating the semiconductor chip, the fine metal wires and end portions of the leads. The end portions of the leads overlap a peripheral portion of the die pad with a predetermined elevation difference with respect to the die pad. Moreover, the end portions are electrically isolated from the die pad.

Also, the present invention provides a process for fabricating a resin-encapsulated semiconductor device utilizing either of the aforesaid lead frames. The method includes transforming the aforesaid lead frame in such a manner that the die pad is positioned with a predetermined elevation difference with respect to the leads; and mounting a semiconductor chip on the die pad by inserting the semiconductor chip between the die pad and the leads from a direction perpendicular to the longitudinally axis of the lead frame.

The present invention additional provides a mold for use in a process for fabricating a resin-encapsulated semiconductor device of an LOC structure including top and bottom mold halves which cooperatively define a cavity having a shape corresponding to a final configuration of the resin-encapsulated semiconductor device and which respectively have fringes between which a portion of the lead frame is to be releasably held. The fringes of the top and bottom mold halves are configured to accommodate the predetermined elevation difference between the die pad and the leads, and the top and bottom mold halves are configured to allow portions of the frame selvages to serve as part of the mold.

DETAILED DESCRIPTION OF THE PREFERRED EMBODIMENTS

In accordance with the present invention, first and second lead frames to be used for resin-encapsulated semiconductor devices of the LOC structure are one-piece lead frames. More specifically, a die pad, a plurality of leads, at least two support bars, tie bars and two frame selvages are formed into a first or second one-piece lead frame by subjecting a flexible metal sheet to punching, etching or a like process.

The lead frame is preferably formed of a thin metal sheet such as of a copper alloy, iron-nickel alloy or Kovar, having a thickness of about 0.08 mm to about 0.25 mm. The dimensions of the lead frame can be appropriately adjusted depending on the size of a semiconductor chip to be mounted thereon. The lead frame preferably includes a frame having two frame selvages extending parallel to each other and two cross bars extending perpendicular to these two frame selvages.

The plurality of leads may extend parallel to the frame selvages or radially extend relative to the die pad with the end portions thereof positioned around the die pad. For easier fabrication of the lead frame, the leads preferably extend parallel to each other longitudinally of the frame selvages. In particular, the first lead frame may have leads extending toward the die pad in two different directions or in four different directions.

Figure 1:
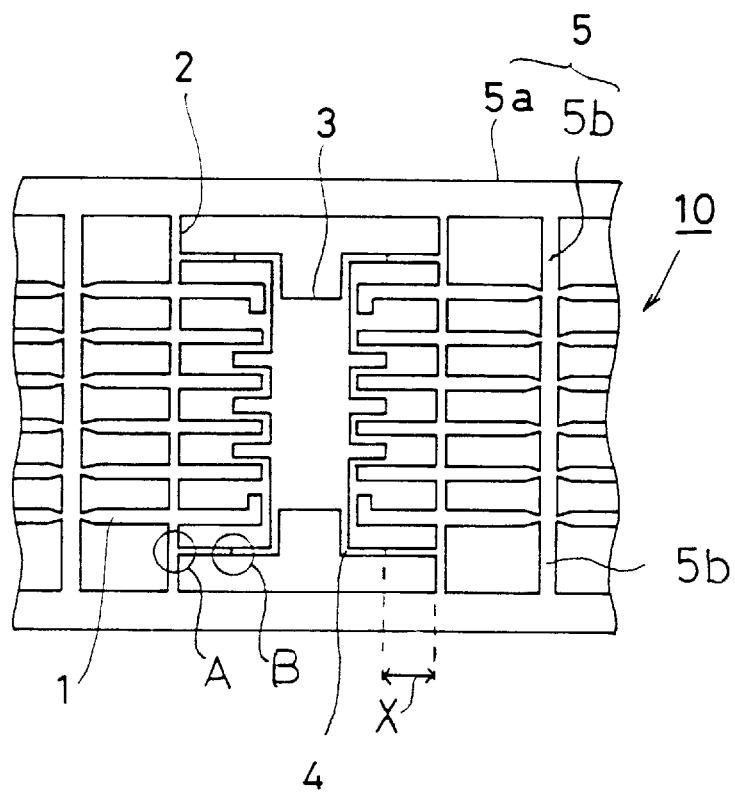
FIG. 1 is a plan view illustrating a first lead frame in in accordance with the present invention.

The configuration of the die pad is not particularly limited, so far as a semiconductor chip can be stably mounted thereon and the contact area between the semiconductor chip and the die pad can be maximized. Exemplary configurations include quadrangles such as square and rectangles, polygons obtained by modifying such quadrangles with portions thereof being cut, configurations obtained by modifying polygons with the corners thereof being rounded, polygons obtained by modifying the quadrangles with the corner portions thereof being projected, and a polygon having a comb-like shape as shown in FIG. 1.

The die pad of the first lead frame is supported by: (1) support bars at least one of which is connected to a tie bar; or (2) support bars at least one of which is connected to one of the frame selvages in a region excluding an orthogonal projection of the die pad but adjacent the connection point between the tie bar and the frame selvage. The die pad of the second lead frame is supported in the same manner as the case (1) or (2), or by (3) support bars directly connected to the frame selvages.

The positions and number of connections points between the support bars and the die pad are not particularly limited, but may be appropriately adjusted such that the support bars can assuredly support the die pad and the semiconductor chip mounted thereon, and such that, in the fabrication process for a semiconductor device using the lead frame, the semiconductor chip can be inserted between the die pad and the leads from a direction perpendicular to the longitudinally axis of the lead frame so as to be mounted on the die pad after only the support bars are transformed or the support bars and the frame selvages are transformed.

Figure 25:
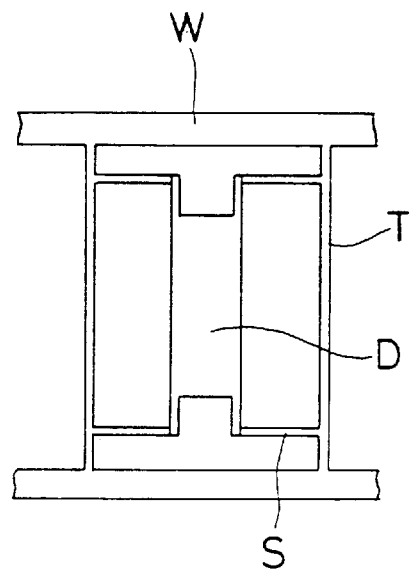
FIGS. 25(a) to 25(d) are schematic plan views illustrating embodiments of interconnection of a die pad, support bars, tie bars and frame selvages.
Figure 25:
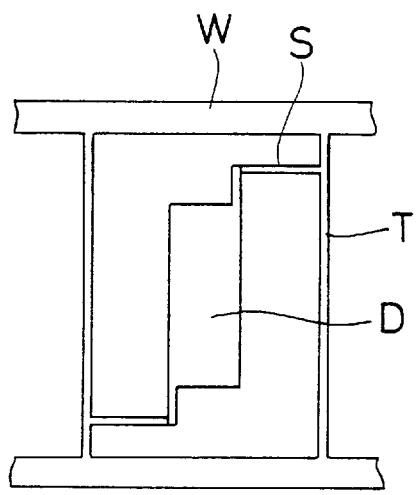
Figure 25:
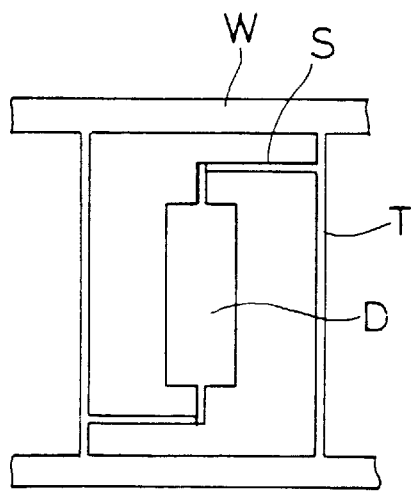
Figure 25:
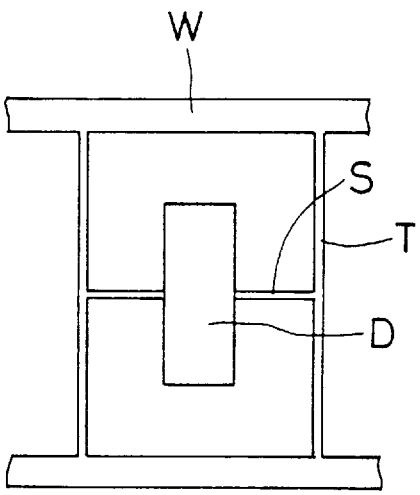

In the case (1) where the die pad is supported by support bars at least one of which is connected to the tie bar, possible arrangements include:

The die pad is supported by four support bars which respectively extend from portions adjacent four corners of the die pad in a direction generally parallel to the frame selvages (see FIG. 25(a)).

The die pad is supported by two support bars which respectively extend from portions adjacent two diagonal corners of the die pad or from sides of the die pad facing opposite the frame selvages in a direction generally parallel to the frame selvages toward different tie bars (see FIGS. 25(b) and 25(c)).

The die pad is supported by two support bars which respectively extend from sides of the die pad facing opposite the leads in a direction generally parallel to the frame selvages (see FIG. 25(d)).

Figure 26:
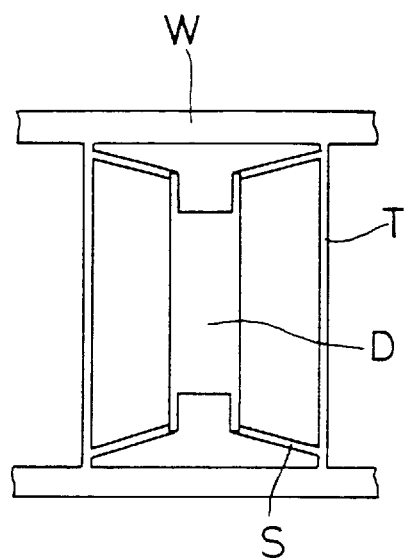
FIGS. 26(a) to 26(c) are schematic plan views illustrating embodiments of interconnection of a die pad, support bars, tie bars and frame selvages.
Figure 26:
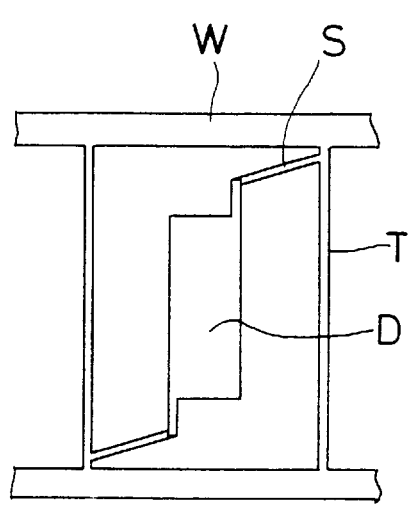
Figure 26:
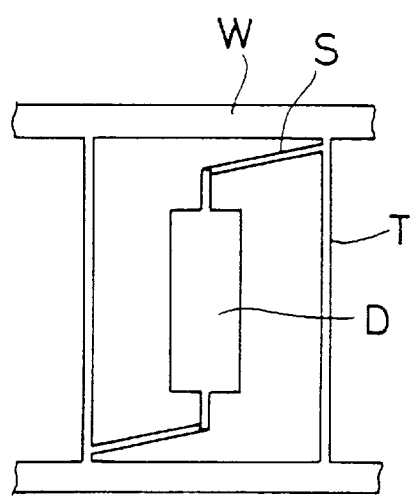

The die pad is supported by four support bars which respectively extend from portions adjacent the four corners of the die pad along lines extending at a predetermined angle with respect to the frame selvages (see FIG. 26(a)).

The die pad is supported by two support bars which respectively extend from portions adjacent two diagonal corners of the die pad or from the sides of the die pad facing opposite the frame selvages along lines extending at a predetermined angle with respect to the frame selvages toward different tie bars (see FIGS. 26(b) and 26(c)).

Figure 27:
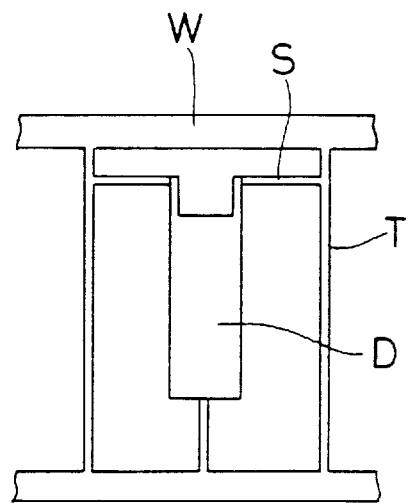
FIGS. 27(a) to 27(c) are schematic plan views illustrating embodiments of interconnection of a die pad, support bars, tie bars and frame selvages.
Figure 27:
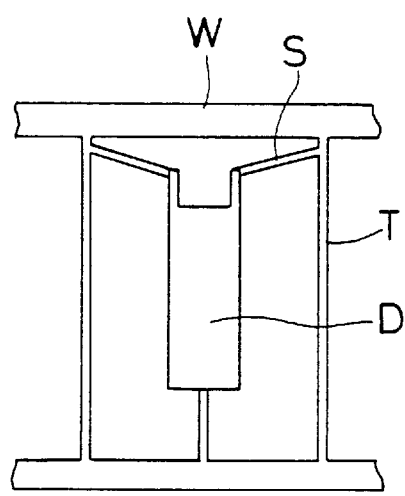
Figure 27:
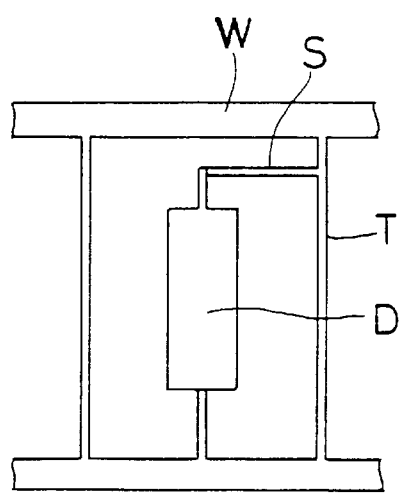

The die pad is supported by two support bars which respectively extend from portions adjacent two corners of the die pad facing opposite one of the frame selvages in a direction generally parallel to the frame selvage or along lines extending at a predetermined angle with respect to the frame selvage and by one support bar which extends from the side of the die pad facing opposite the other frame selvage and is directly connected to the other frame selvage (see FIG. 27(a) and 27(b)).

The die pad is supported by two support bars one of which extends from the side of the die pad facing opposite one of the frame selvages in a direction parallel to the frame selvage and the other of which extends from the side of the die pad facing opposite the other of the frame selvages and is directly connected to the other frame selvage (see FIG. 27(c)).

Figure 28:
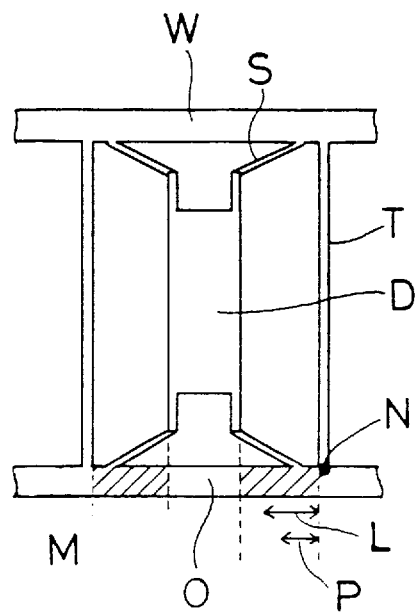
FIGS. 28(a) to 28(c) are schematic plan views illustrating embodiments of interconnection of a die pad, support bars, tie bars and frame selvages.
Figure 28:
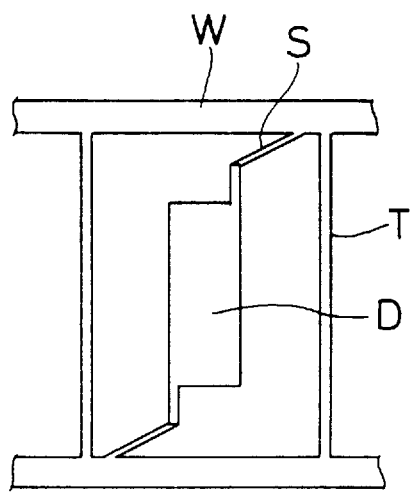
Figure 28:
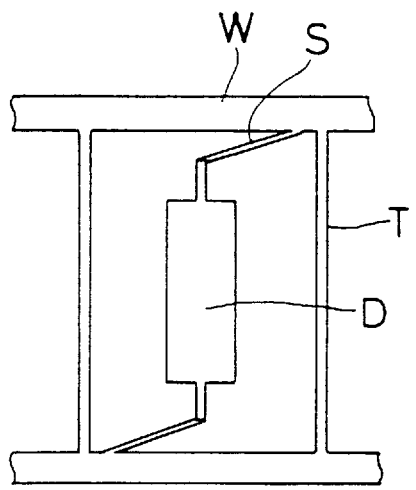

In the case (2) where the die pad is supported by support bars at least one of which is connected to one of the frame selvages in a region excluding an orthogonal projection O of the die pad but adjacent the connection point between the tie bar and the frame selvage, the region to which the support bar is connected includes regions (M in FIG. 28(a)) of the frame selvage portion which do not directly face opposite the die pad, more preferably regions each defined between the connection point (N in FIG. 28(a)) and a point spaced apart from the connection point by a distance (L in FIG. 28(a)) about two thirds the minimum distance between the tie bar and the die pad, still more preferably regions each defined between the connection point N and a point spaced apart from the connection point by a distance (P in FIG. 28(a)) about half the minimum distance. More specifically, possible arrangements include:

The die pad is supported by four support bars which respectively extend from portions adjacent the four corners of the die pad and are respectively connected to the nearest ones of the aforesaid regions of the frame selvages (FIG. 28(a)).

The die pad is supported by two support bars which respectively extend from portions adjacent two diagonal corners of the die pad or from the sides of the die pad facing opposite the frame selvages along lines extending at a predetermined angle with respect to the frame selvages and are connected to the nearest ones of the aforesaid regions of the frame selvages (see FIGS. 28(b) and 28(c)).

Figure 29:
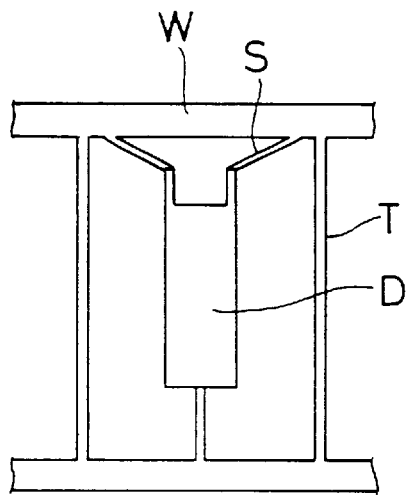
FIGS. 29(a) and 29(b) are schematic plan views illustrating embodiments of interconnection of a die pad, support bars, tie bars and frame selvages.
Figure 29:
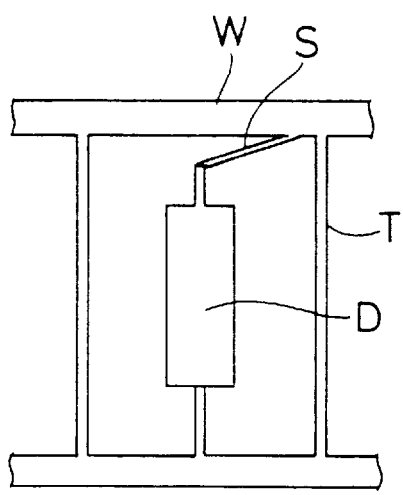
Figure 30:
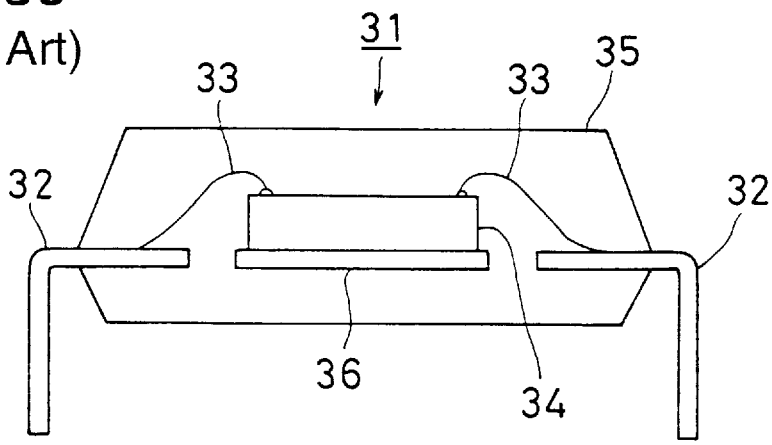
FIG. 30 is a schematic sectional view illustrating a conventional resin-encapsulated semiconductor device.
Figure 31:
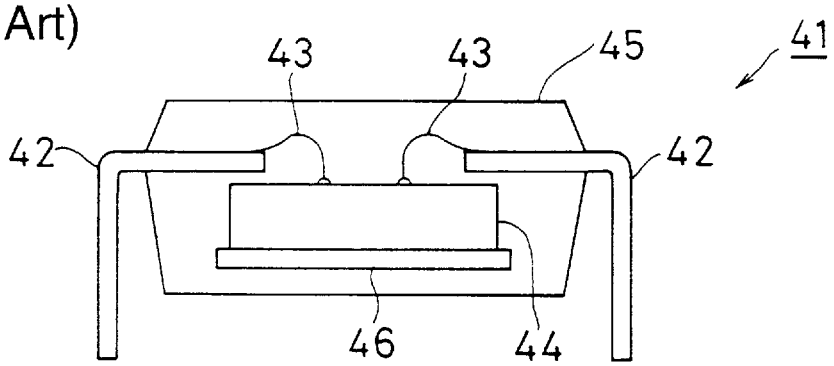
FIG. 31 is a schematic sectional view illustrating another conventional resin-encapsulated semiconductor device.
Figure 32:
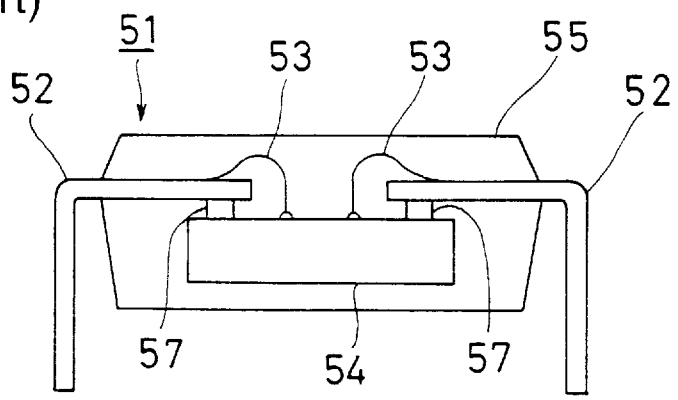
FIG. 32 is a schematic sectional view illustrating still another conventional resin-encapsulated semiconductor device.
Figure 33:
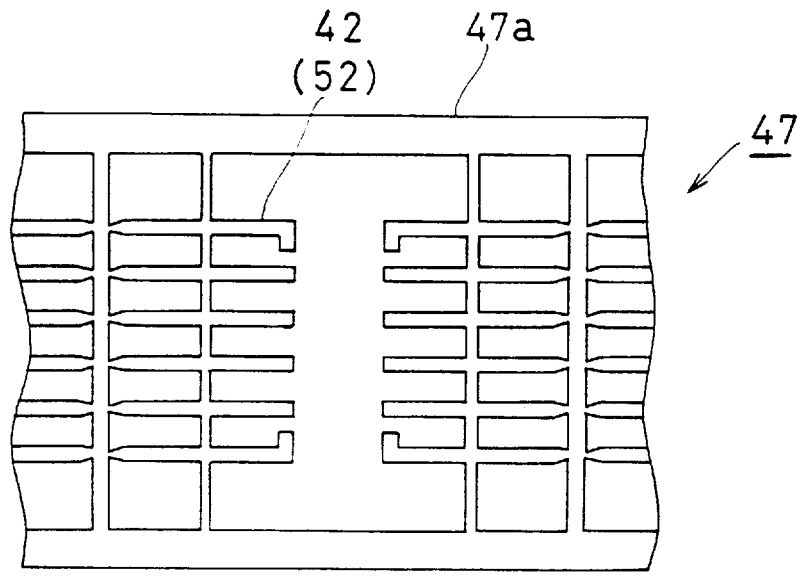
FIG. 33 is a plan view illustrating a conventional lead frame corresponding to the first lead frame of the present invention.
Figure 34:
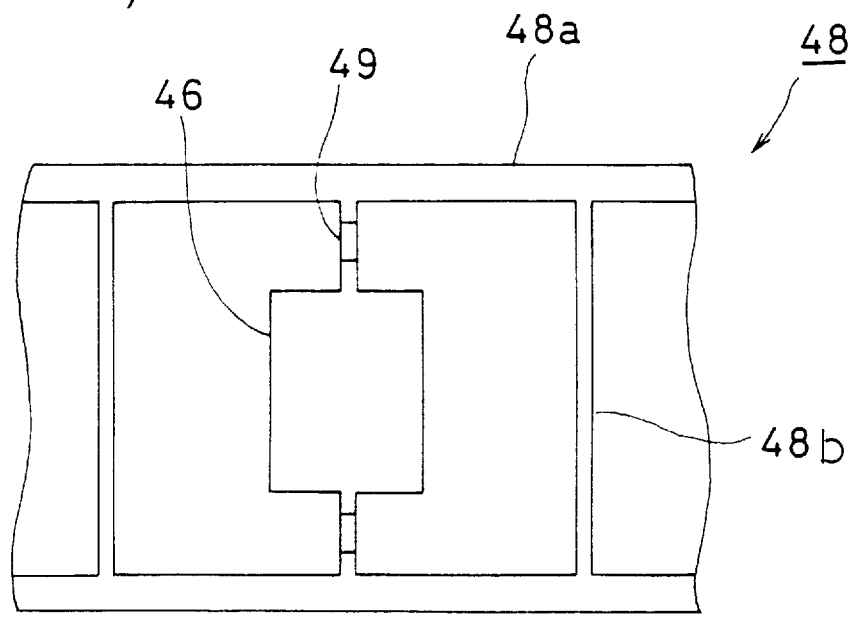
FIG. 34 is a plan view illustrating a conventional lead frame corresponding to the second lead frame of the present invention.

The die pad is supported by two support bars which respectively extend from portions adjacent two corners of the die pad facing opposite one of the frame selvages and are connected to the nearest ones of the aforesaid regions and by one support bar which extends from the side of the die pad facing opposite the other frame selvage and is connected to the other frame selvage (see FIG. 29(a)).

The die pad is supported by two support bars one of which extends from a portion adjacent one corner of the die pad facing opposite one of the frame selvages and is connected to one of the aforesaid regions of the frame selvage and the other of which extends from the side of the die pad facing opposite the other frame selvage and is connected to the other frame selvage (see FIG. 29(b)).

It is noted that the die pad is of a generally rectangular configuration and the leads are not shown but only the frame selvages W, tie bars T, die pad D and support bars S are shown in FIGS. 25(a) to 29(b).

In a process for fabricating a semiconductor device using the first lead frame, it is necessary to prevent the breakage of the support bars of the lead frame which may be caused by stretching the support bars. For this reason, the support bars preferably extend not parallel to the frame selvages but along lines extending at a predetermined angle with respect to the frame selvages, or are undulated to be allowed to have relatively great lengths.

In the case (3) where the die pad is supported by support bars directly connected to the frame selvage, the support bars extend from middle portions of the opposite sides of the die pad facing opposite the frame selvages, or at least one of the support bars extends from a middle portion of the side of the die pad facing opposite one of the frame selvages. In this case, an inner side portion of the frame selvage facing opposite the die pad and connected to the support bar is slightly indented, so that the frame selvage has a narrower width in that particular portion thereof. The width of the frame selvage gradually becomes narrower from the connection point between the tie bar and the frame selvage toward the connection point between the support bar and the frame selvage, and becomes constant in the proximity of that connection point (indicated by a reference character 15a in FIG. 8). The width and position of the narrow portion are appropriately determined depending on the elevation difference between the die pad and the leads produced when a resin-encapsulated semiconductor device is fabricated by using the lead frame, and the inclination angle of side faces of the semiconductor package. Where the elevation difference is 2.85 mm and the inclination angle is 10°, for example, the width around the connection point between the support bar and the frame selvage is preferably narrower by about 0.1 mm to about 0.9 mm, preferably about 0.3 mm to about 0.7 mm, more preferably about 0.50 mm (corresponding to the amount indicated by a reference character E in FIG. 14) than the rest, and the width-turning point is appropriately determined in consideration of these values.

A resin-encapsulated semiconductor device according to the present invention is fabricated by using the aforesaid first or second lead frame. In a fabrication process for the resin-encapsulated semiconductor device, the lead frame is transformed into a predetermined shape such that the die pad is positioned with an elevation difference with respect to the leads, i.e., the die pad is disposed lower than the leads.

Where the first lead frame is used, for example, the support bars are stretched to provide a predetermined elevation difference between the die pad and the leads. Where the second lead frame is used, portions of the frame selvages are bent to sink the die pad along with the support bars and the narrow portions of the frame selvages with respect to the leads. Alternatively, portions of the frame selvages and the support bars are bent to sink the die pad along with the narrow portions of the frame selvages with respect to the leads. Thus, a predetermined elevation difference is made between the die pad and the leads. By thus transforming the lead frame, the end portions of the leads overlap an area defined by the peripheral portion of the die pad with the leads electrically isolated from the die pad.

The elevation difference between the die pad and the leads is not particularly limited, but preferably corresponds to the thickness of the semiconductor chip plus some clearance. An elevation difference less than the thickness of the semiconductor chip makes it impossible to mount the semiconductor chip on the die pad and, therefore, is not preferable. An elevation difference excessively greater than the thickness of the semiconductor chip increases the dimensions of a finally fabricated resin-encapsulated semiconductor device and, therefore, is not preferable. In particular, where the first lead frame is used, the elevation difference is made by stretching the support bars and, therefore, the support bars supporting the die pad may become thinner and narrower than necessary. This makes it impossible for the die pad to support the semiconductor chip mounted thereon and, therefore, is not preferable.

The semiconductor chip to be used in the present invention has a plurality of terminals formed thereon, and is fixedly mounted on the die pad. To fix the semiconductor chip on the die pad, an adhesive tape or a die bond adhesive such as an epoxy resin is used. The die bond adhesive is used in terms of economy. Exemplary materials of fine metal wires to be used to connect the terminals of the semiconductor chip to the ends of the leads include known conductive materials such as gold, silver and copper. The bonding of the fine metal wires to the terminals and leads is achieved by a known method such as a hot press. Exemplary resin encapsulates for encapsulating the semiconductor chip and other components include known resins such as epoxy resins, phenolic resins and silicone resins. The semiconductor package can be formed by molding.

A first process for fabricating a resin-encapsulated semiconductor device in accordance with the present invention utilizing the first lead frame includes the steps of: (i) transforming the first lead frame by stretching the support bars thereof so that the die pad thereof is positioned with a predetermined elevation difference with respect to the leads; (ii) inserting a semiconductor chip between the die pad and the leads from a direction perpendicular to the longitudinal axis of the lead frame to mount the semiconductor chip on the die pad (i.e., transferring the semiconductor chip parallel to the plane of the die pad or the leads to mount the semiconductor chip on the die pad) and fixing the semiconductor chip on the die pad; (iii) connecting electrodes of the semiconductor chip and the corresponding ends of the leads, and encapsulating the resulting structure with a resin; and (iv) plating surfaces of the leads, marking the resulting semiconductor assembly, and trimming and-forming the leads. Since the leads overlap the semiconductor chip, the die pad, for example, of a quadrangular shape has a smaller major area than the semiconductor chip. Therefore, by forming the die pad into a comb-like shape as shown in FIG. 1, the contact area between the semiconductor chip and the die pad is increased to stably mount the semiconductor chip on the die pad.

A second process for fabricating a resin-encapsulated semiconductor device in accordance with the present invention employs the second lead frame of the present invention or a conventional one-piece lead frame. The conventional one-piece lead frame has substantially the same configuration as the second lead frame except that the one-piece lead frame includes frame selvages having a constant width.

In the second fabrication process, portions of the frame selvages of the second lead frame or the conventional one-piece lead frame are bent to sink along with the support bars and the die pad with respect to the plane of the leads in order to make a sufficient elevation difference between the die pad and the leads so that the semiconductor chip can be inserted therebetween. Alternatively, the narrow portions of the frame selvages of the second lead frame or portions of the conventional one-piece lead frame are bent to sink along with the die pad in order to make a sufficient elevation difference between the. die pad and the leads. Thereafter, the steps (ii) to (iv) are performed to complete a resin-encapsulated semiconductor device. Where the frame selvages and the support bars are bent, it is necessary to bend the support bars along a line defined between opposite bending points on the frame selvages.

In this fabrication process, the predetermined elevation difference between the die pad and the leads may otherwise be made by bending the portions of the frame selvages and, as required, the support bars to sink the die pad with respect to the plane of the leads after the semiconductor chip is mounted on the die pad of the lead frame.

To bend the portions of the frame selvages and, as required, the support bars, the lead frame is pressed by using upper and lower press dies having a configuration corresponding to the final configuration of the lead frame.

To encapsulate the semiconductor chip mounted on the die pad of the second lead frame or the conventional one-piece lead frame with a resin encapsulant, a mold including top and bottom mold halves of desired configurations is used. The top and bottom mold halves cooperatively define a cavity having a configuration corresponding to the final configuration of the resin-encapsulated semiconductor device, and respectively have fringes between which a portion of the lead frame is releasably held. The fringes of the top and bottom mold halves are configured to accommodate the predetermined elevation difference between the die pad and the leads. The top and bottom mold halves, when combined with each other, allow portions of the frame selvages to serve as part of the mold. More specifically, with the second lead frame, the inner side faces of the frame selvages which have the elevation difference with respect to the leads serve as part of the mold (which define part of the cavity) to prevent a resin injected into the mold from flowing out of the mold. With the conventional one-piece lead frame, the inner faces of the portions of the frame selvages which form part of the bottom portion serve as part of the mold to prevent a resin injected into the mold from flowing out of the mold. The inner faces of the top and bottom mold halves each have an inclination such that the cross sectional area thereof gradually becomes greater from the bottom portion to the fringe thereof, to facilitate the releasing of the resulting resin-encapsulated body from the mold. The inclination of the inner faces is not particularly limited, but is preferably about 10°. The material of the mold is not particularly limited, but may be any of those commonly used for the fabrication of a resin-encapsulated semiconductor device.

As mentioned above, the present invention provides lead frames, resin-encapsulated semiconductor devices and fabrication processes therefor, and a mold for use in the fabrication processes, which can minimize the process steps, process time and cost required for the fabrication of semiconductor devices.

The lead frames, resin-encapsulated semiconductor device and fabrication process therefor will hereinafter be fully described with reference to the attached drawings.

EXAMPLE 1 (first lead frame)

Figure 2:
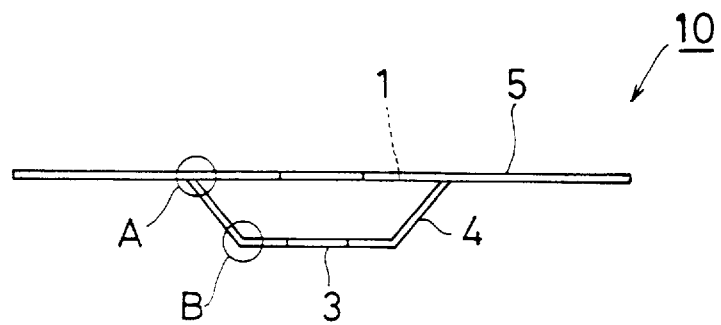
FIG. 2 is a front view illustrating the first lead frame in a transformed state.

A lead frame 10 is shown in FIGS. 1 and 2. The lead frame 10 has a frame 5 including frame selvages 5a and cross bars 5b, a plurality of leads 1 connected to the cross bars 5b, tie bars 2 supporting the leads 1, a die pad 3, and support bars 4 extending parallel to the leads 1 and supporting the die pad 3, which are all integrally formed into one piece.

In a fabrication process, the support bars of the lead frame 10 are bent at points A and B shown in FIG. 2 by press working to transform the lead frame 10 into a predetermined configuration such that an elevation difference of about 510 $\mu$m is made between the leads 1 and the die pad 3. The elevation difference is determined by the sum of the thickness (about 400 $\mu$m) of a semiconductor chip to be used, the thickness (about 10 $\mu$m) of resin paste preliminarily applied onto the die pad 3 and a clearance (about 100 $\mu$m) required for the insertion of the semiconductor chip between the die pad 3 and the leads 1.

Next, an explanation will be given to a method of mounting the semiconductor chip onto the die pad of the lead frame with reference to FIGS. 3 to 5.

The support bars of the lead frame 10 are transformed into a desired configuration to sink the die pad 3 by about 510 $\mu$m with respect to the leads 1.

Figure 3:
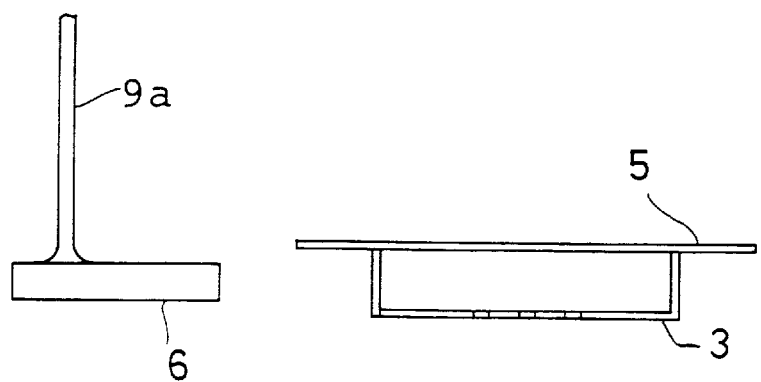
FIGS. 3 and 4 are diagrams for explaining a process step of mounting a semiconductor chip on the lead frame according to the resent invention.

Then, the top surface of the semiconductor chip 6 is sucked with a collet 9a for holding the semiconductor chip 6 as shown in FIG. 3. In turn, the semiconductor chip 6 is transferred parallel to the die pad in a direction perpendicular to the longitudinal axis of the lead frame 10, and inserted between the die pad 3 and the leads 1. As soon as an end portion of the semiconductor chip 6 passes under one of the frame selvages 5a, the semiconductor chip 6 is held by another collet 9b so as to be transported onto the die pad 3.

Figure 4:
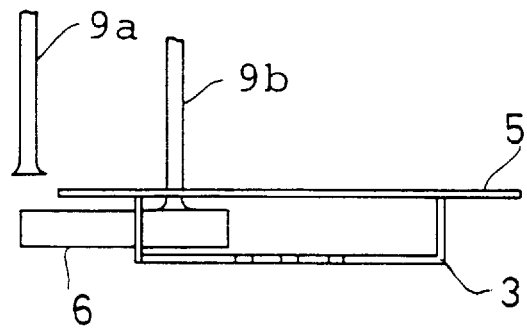
Figure 5:
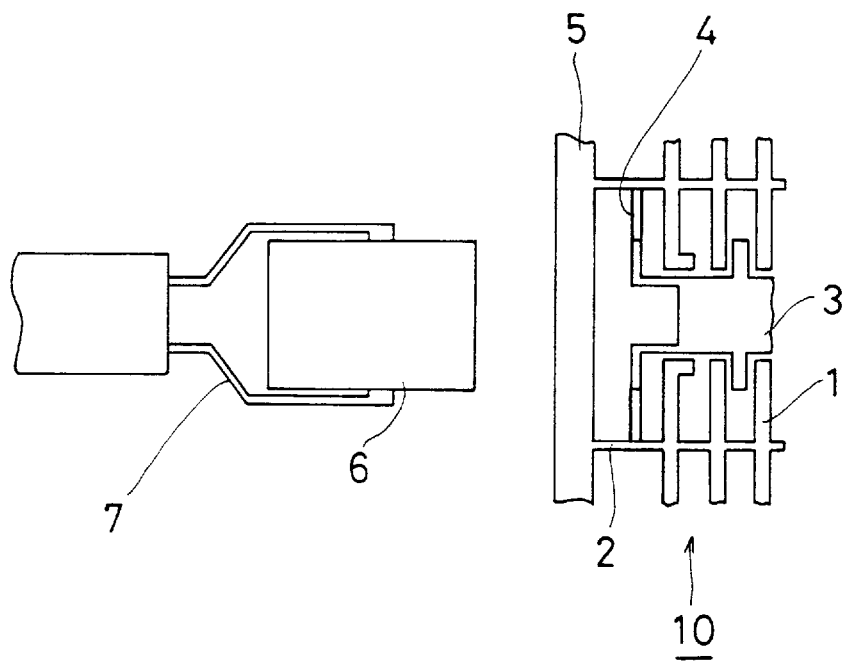
FIG. 5 is a plan view for explaining another process step of mounting the semiconductor chip on the lead frame according to the present invention.

Instead of using the collets 9a and 9b shown in FIGS. 3 and 4, a transportation jig 7 for holding the semiconductor chip 6 by edges thereof may be used to transport the semiconductor chip 6 onto the die pad 3 parallel thereto.

Figure 6:
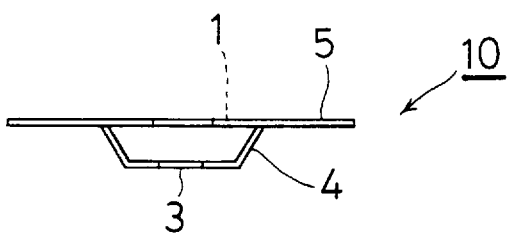
FIGS. 6(a) to 6(d) are diagrams for explaining a process for fabricating a resin-encapsulated semiconductor device in accordance with the present invention.
Figure 6:
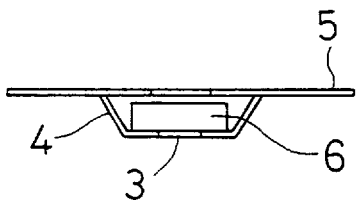
Figure 6:
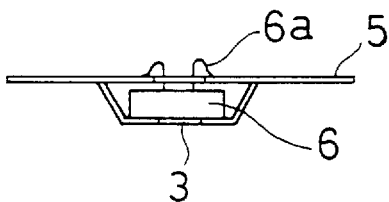
Figure 6:
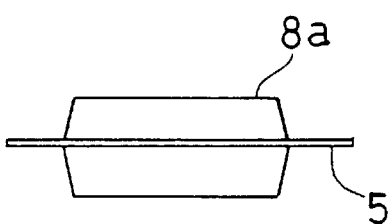

With reference to FIG. 6, there will next be described a process for fabricating a resin-encapsulated semiconductor device by using the aforesaid lead frame.

First, as shown in FIG. 6(a), the lead frame 10 is pressed by means of upper and lower press dies (not shown) to stretch the support bars 4 so that the die pad 3 is sunk with respect to the plane of the leads 1.

As shown in FIG. 6(b), the semiconductor chip 6 is then transported onto the die pad 3 in the aforesaid manner, and fixed on the die pad 3 preliminarily applied with resin paste by heating at a temperature of 180° C. for 60 minutes.

Figure 7:
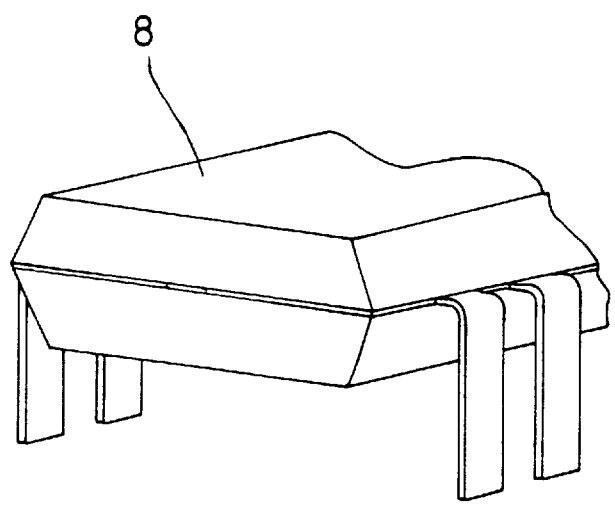
FIG. 7 is a perspective view illustrating the resin-encapsulated semiconductor device in accordance with the present invention.

In turn, as shown in FIG. 6(c), the terminals formed on the semiconductor chip 6 are respectively connected to the corresponding leads 1 with fine metal wires 6a. The resulting structure is encapsulated with a resin as shown in FIG. 6(d). Then, the resulting semiconductor package is subjected to plating of surfaces of the leads 1, marking, and trimming and forming of the leads 1. Thus, a resin-encapsulated semiconductor device 8 as shown in FIG. 7 is completed.

EXAMPLE 2 (second lead frame)

A lead frame 20a is shown in FIGS. 8 to 11. The lead frame 20a has a frame 15 including frame selvages 15b and cross bars 15c, leads 11 connected to the cross bars 15c, tie bars 12 supporting the leads 11, a die pad 13, and support bars 14 respectively extending perpendicular to the leads 11 and connected to the frame selvages 15b to support the die pad 13, which are all integrally formed into one piece. The frame selvages 15b each include a portion 15a having a narrower width to which the corresponding support bar is connected.

Figure 8:
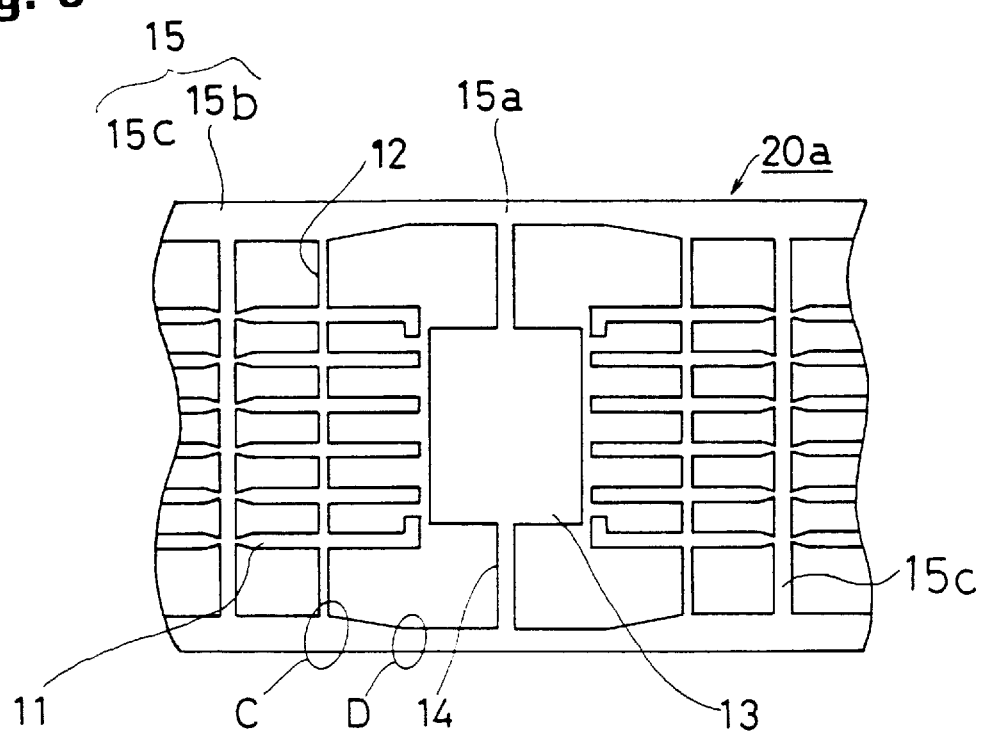
FIG. 8 is a plan view illustrating a second lead frame in accordance with the present invention.
Figure 12:
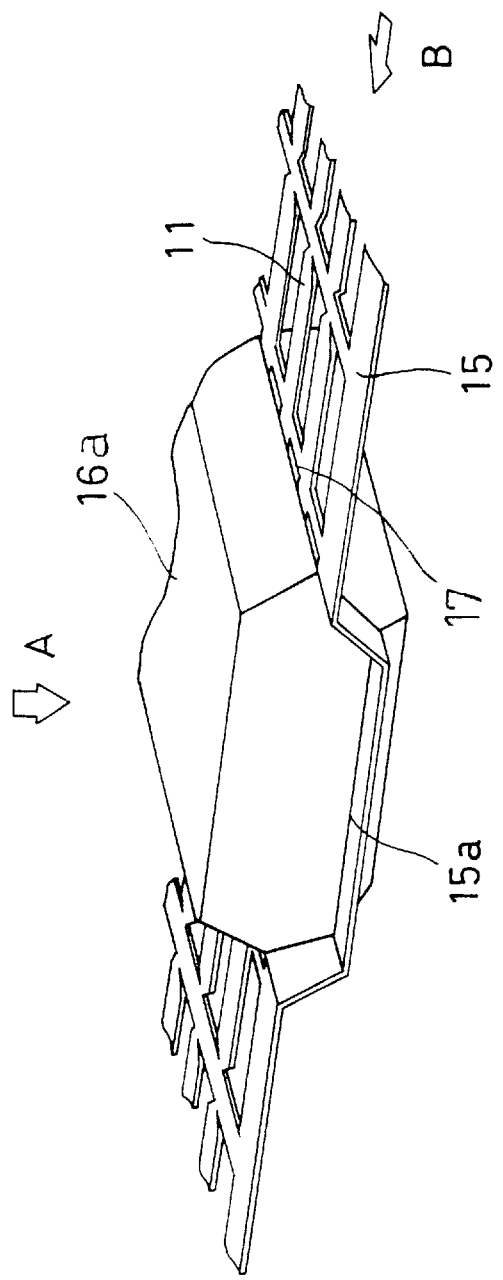
FIG. 12 is a perspective view illustrating a resin-encapsulated body obtained during a fabrication process for a resin-encapsulated semiconductor device using the second lead frame.
Figure 13:
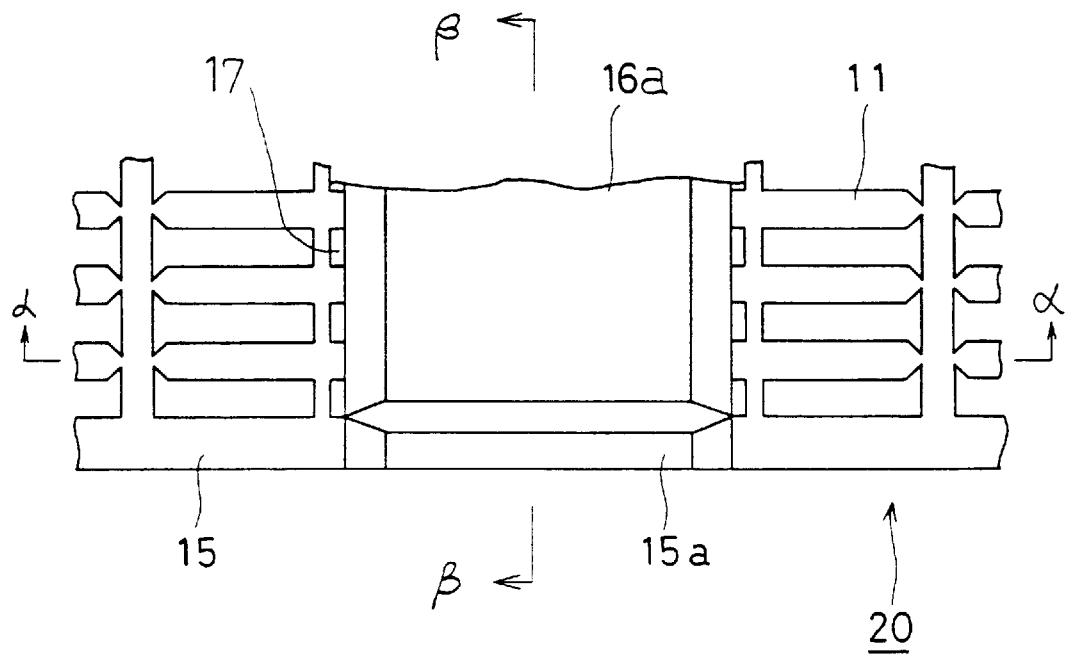
FIG. 13 is a plan view illustrating the resin-encapsulated body of FIG. 12.
Figure 14:
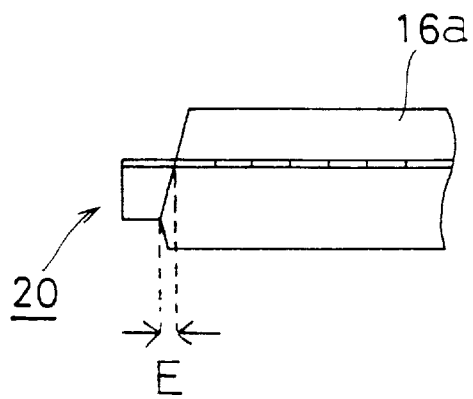
FIG. 14 A side view illustrating the resin-encapsulated body of FIG. 12.

In a fabrication process, the frame selvages 15b of the lead frame 20a are bent at points indicated by C and D in FIG. 8 by press working to transform the lead frame 10 into a predetermined configuration such that an elevation difference of about 510 $\mu$m is made between the leads 11 and the die pad 13. The elevation difference is determined by the sum of the thickness of a semiconductor chip to be used, the thickness of the resin paste and a clearance required for the insertion of the semiconductor chip between the die pad 13 and the leads 11. As shown in FIGS. 12 to 14, the narrow portions 15a of the frame selvages 15b are each formed into a configuration corresponding to the final configuration of a resin-encapsulated semiconductor device.

When the semiconductor chip is to be mounted on the lead frame 20 by using a collet 9a as shown in FIG. 3, the semiconductor chip is not required to pass under the frame selvage 15b. There is no need to hold the semiconductor chip with another collet 9b. Therefore, the semiconductor chip can be mounted on the die pad 13 by using only the collet 9a sucking the semiconductor chip. As in example 1, a transportation jig 7 for holding the semiconductor chip by the edges thereof may otherwise be used to insert the semiconductor chip between the die pad 13 and the leads 11 from a direction perpendicular to the leads 11 and parallel to the die pad 13 and place it onto the die pad 13.

The fixing of the semiconductor chip onto the die pad 13 and the connection between terminals on the top face of the semiconductor chip and the leads are achieved in the same manner as in EXAMPLE 1.

Figure 15:
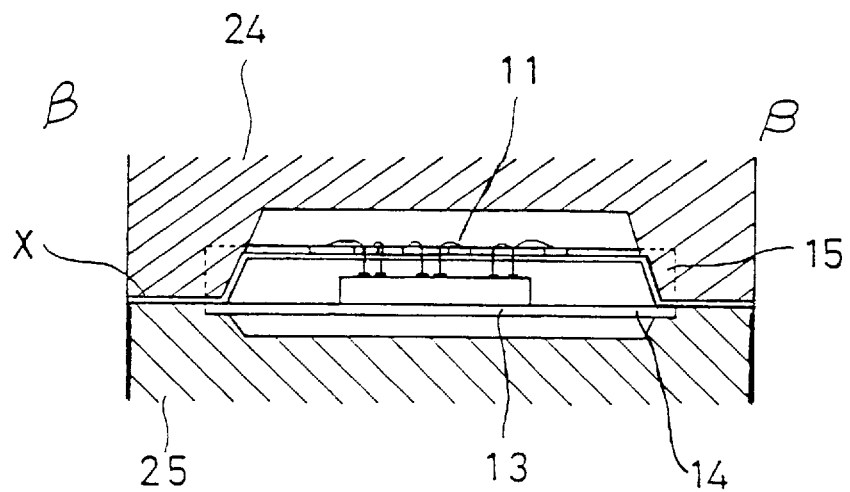
FIG. 15 is a vertical sectional view illustrating a mold in accordance with the present invention.
Figure 16:
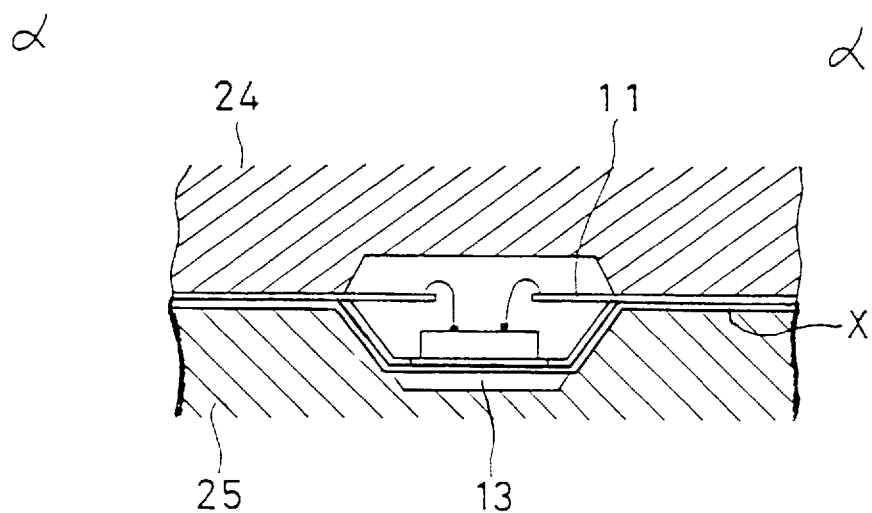
FIG. 16 is a transverse sectional view illustrating the mold in accordance with the present invention.

The resin encapsulation is achieved by using a mold including top and bottom mold halves 24 and 25 the fringes of which are configured as corresponding to the configuration of the frame selvages 15b. The mold to be used is shown in FIGS. 15 and 16. FIG. 15 is a sectional view illustrating the mold, in which the lead frame 20 including the semiconductor chip fixed on the die pad 13 and the leads 11 connected to the terminals of the semiconductor chip with fine metal wires is held between the top mold half 24 and the bottom mold half 25. FIG. 15 corresponds to a sectional view taken along line β—β of FIG. 13. FIG. 16 is a sectional view illustrating the mold holding the lead frame 20 of FIG. 13 between the top and bottom mold halves 24 and 25 thereof, taken along line d—d of FIG. 13. In FIGS. 15 and 16, the portion above line X and the portion below line X correspond to the top mold half 24 and the bottom mold half 25, respectively.

Where the top and bottom mold halves 24 and 25 shown in FIGS. 15 and 16 are used for the resin encapsulation, the frame selvages 15b serve as part of the mold and, therefore, the resin contacts the inner side faces of the narrow portions 15a of the frame selvages 15b. More specifically, as shown in FIG. 12, end portions of the resin-encapsulated body each have a configuration congruent with the inner side face of the narrow portion 15a of the frame selvage 15b. If the frame selvages 15b are not provided with narrow portions 15a and the mold is configured such that ends of the resulting resin-encapsulated body are aligned with a line defined between connection points of the tie bar and frame selvages, the top and bottom mold halves would need to have end faces outwardly inclined toward the fringes thereof. In such a case, portions of the frame selvages 15b would be embedded in the resin encapsulant. To avoid this, the frame selvages 15b are configured to have the narrow portions 15a. The resulting resin-encapsulated body has a flash between the tie bars 12 and the resin-encapsulated body, which can be readily removed in a later step. The fringes of the top and bottom mold halves 24 and 25 abut each other with intervention of the portions of the lead frame 20. The fringes of the top and bottom mold halves 24 and 25 are configured as corresponding to the inner side configuration of the narrow portions 15a of the frame selvages 15b and the elevation difference between the die pad and the leads.

Figure 17:
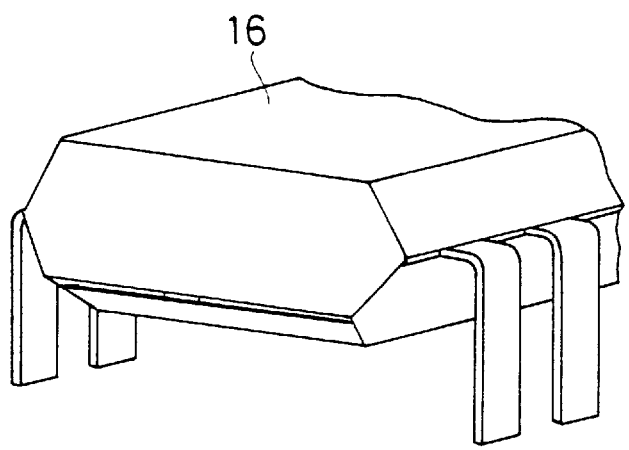
FIG. 17 is a perspective view illustrating another resin-encapsulated semiconductor device in accordance with the present invention.

The resulting resin-encapsulated body is subjected to plating of surfaces of the leads 11, marking, and trimming and forming of the leads 11 in the same manner as in EXAMPLE 1. In the lead trimming and forming process, the resin flash 17 may be removed. Thus, a resin-encapsulated semiconductor device as shown in FIG. 17 is completed.

EXAMPLE 3 (second lead frame)

Figure 9:
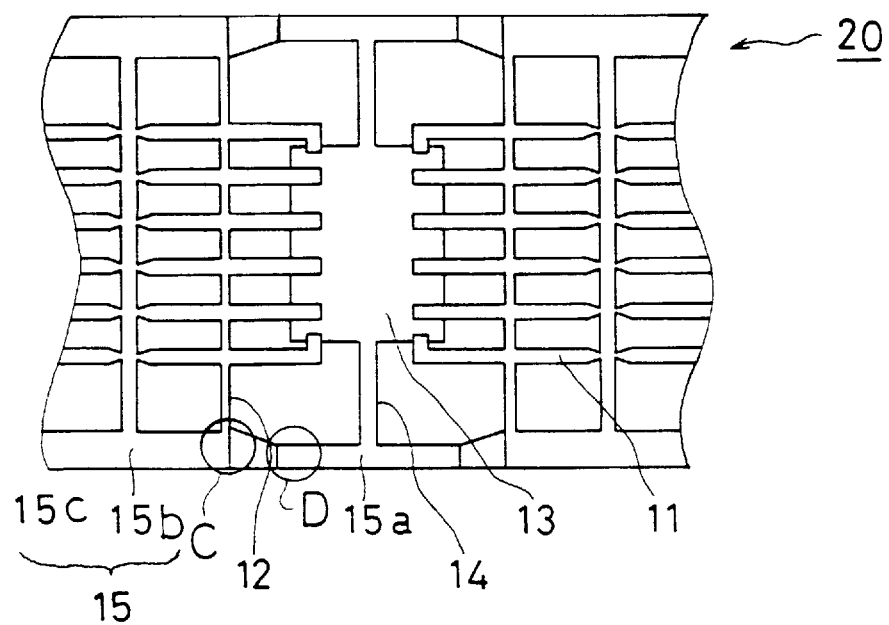
FIG. 9 is a plan view illustrating the lead frame of FIG. 8 in a transformed state.
Figure 10:
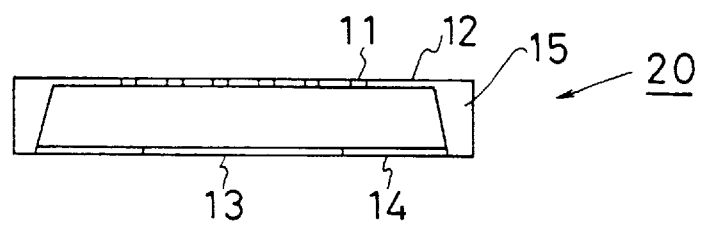
FIG. 10 is a side view illustrating the lead frame of FIG. 9.
Figure 11:
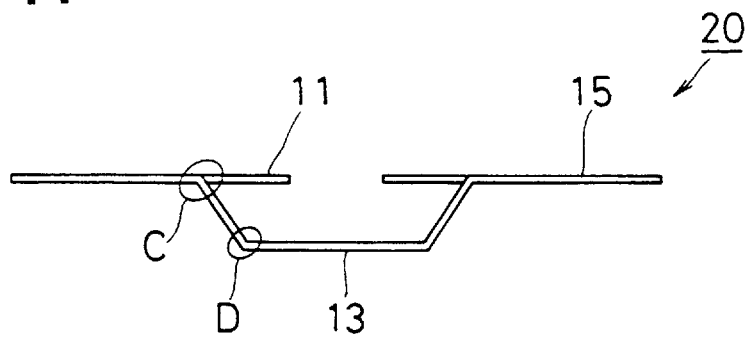
FIG. 11 is a front view illustrating the lead frame of FIG. 9.

By using a lead frame having the same configuration as in EXAMPLE 2, a resin-encapsulated semiconductor device 16 is fabricated. First, a semiconductor chip is fixed on the die pad 13 of the lead frame 20a as shown in FIG. 8. Then, the narrow portions 15a of the frame selvages 15b of the lead frame 20a are transformed as shown in FIG. 9 by press working. After the electrodes formed on the surface of the semiconductor chip are connected to the corresponding leads 11 with fine metal wires, the resulting structure is encapsulated with a resin by using the mold shown in FIGS. 15 and 16.

In turn, the resulting resin-encapsulated body is subjected to plating of surfaces of the leads 11, marking, and trimming and forming of the leads 11 in the same manner as in EXAMPLE 1. Thus, a resin-encapsulated semiconductor device 16 is completed.

EXAMPLE 4 (conventional one-piece lead frame)

FIGS. 18 to 21 illustrate a conventional one-piece lead frame. The lead frame 60a has substantially the same configuration as the lead frame 20a shown in FIG. 8, except that frame selvages 65a thereof are configured to have a constant width.

Figure 18:
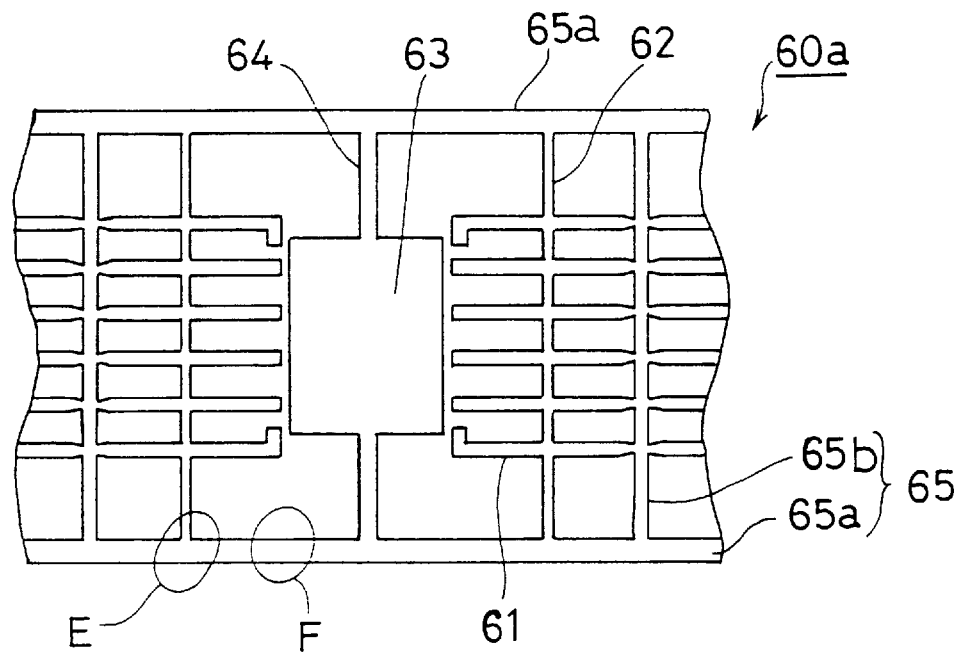
FIG. 18 is a plan view illustrating a conventional one-piece lead frame.
Figure 19:
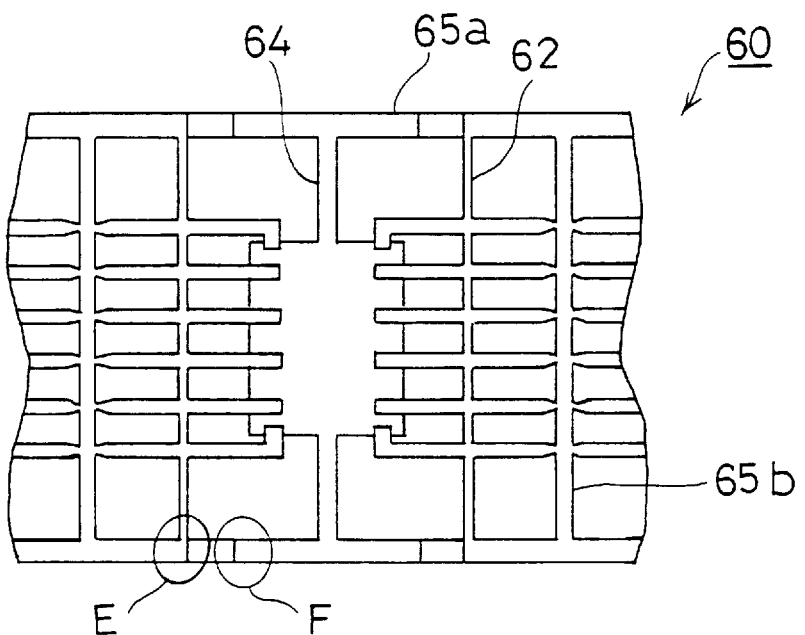
FIG. 19 is a plan view illustrating the one-piece lead frame of FIG. 18 in a transformed state.
Figure 20:
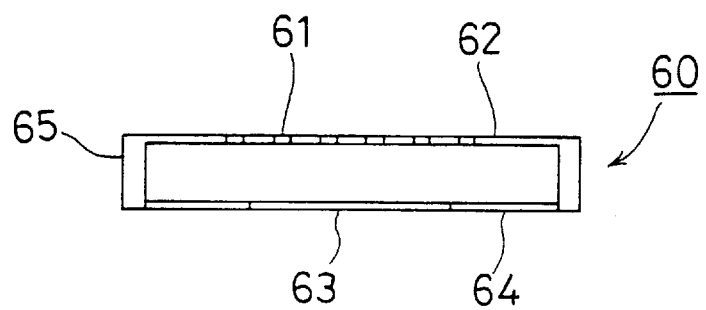
FIG. 20 is a side view illustrating the lead frame of FIG. 19.
Figure 21:
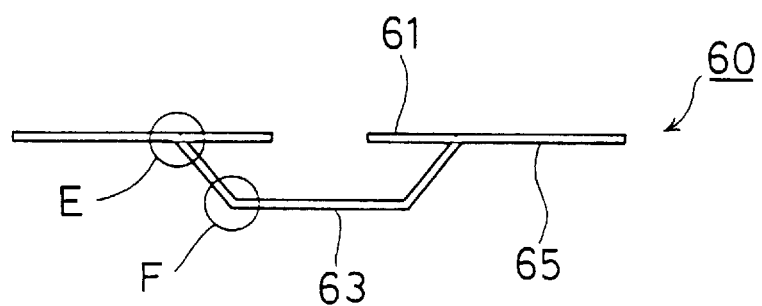
FIG. 21 is a plan view illustrating the lead frame of FIG. 19.

In a fabrication process, the frame selvages 65a are bent at points E and F shown in FIG. 18 by press working to transform the lead frame 60a into a predetermined configuration. This provides an elevation difference of about 510 μm between leads 61 and a die pad 63 as shown in FIGS. 19 to 21. The elevation difference is determined by the sum of the thickness of a semiconductor chip to be used, the thickness of the resin paste, and a clearance required for mounting the semiconductor chip.

Figure 22:
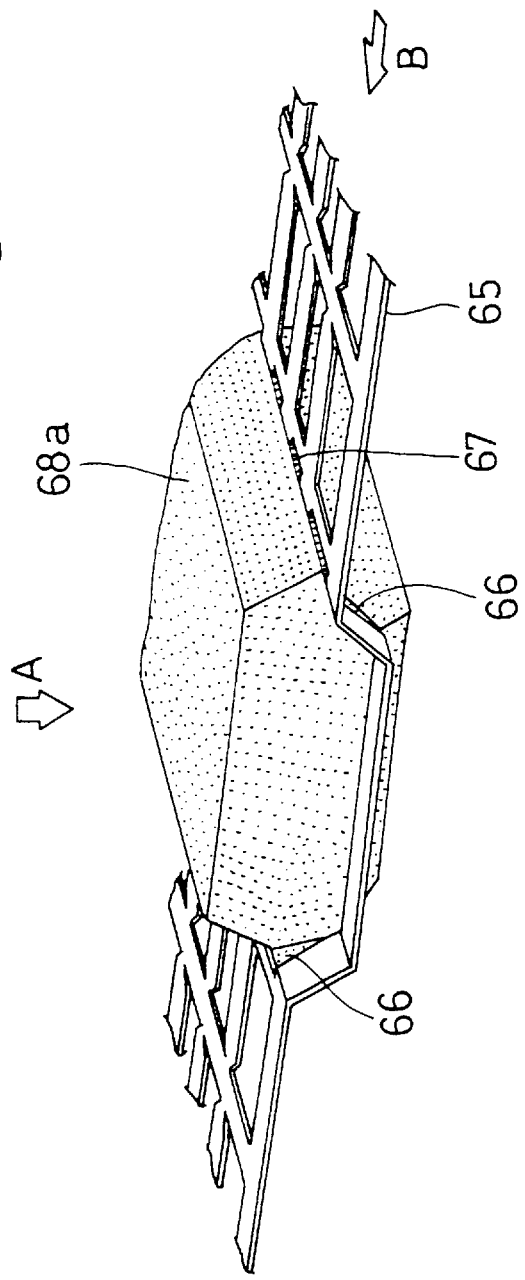
FIG. 22 is a perspective view illustrating a resin-encapsulated body obtained during a process for fabricating a resin-encapsulated semiconductor device using the conventional one-piece lead frame.
Figure 23:
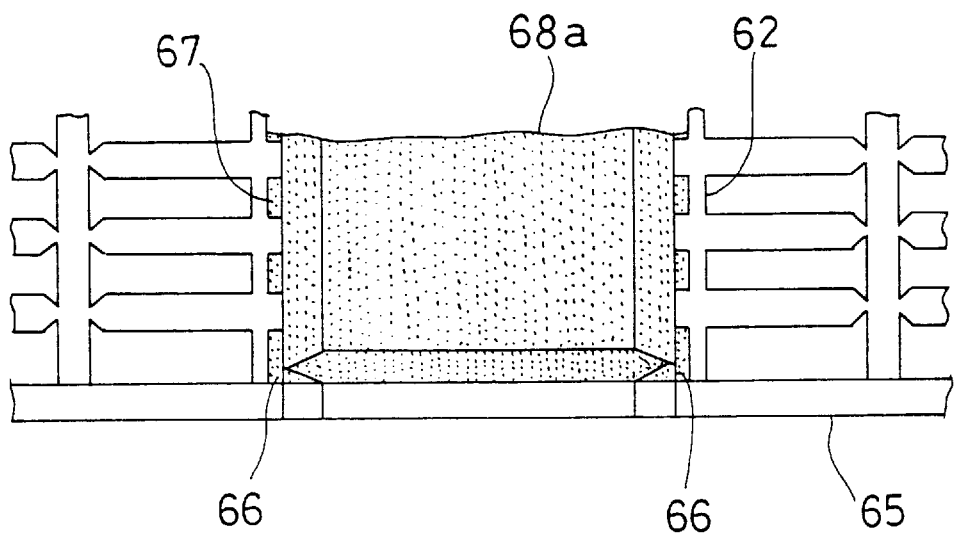
FIG. 23 is a plan view illustrating the molded resin-encapsulated body of FIG. 22.
Figure 24:
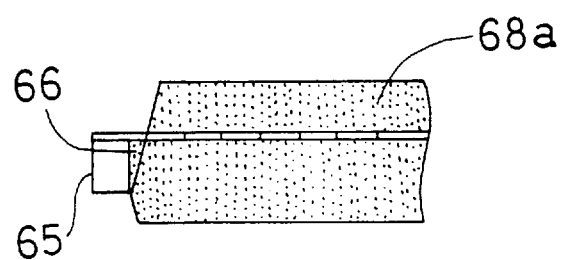
FIG. 24 is a side view illustrating the resin-encapsulated body of FIG. 22.

The semiconductor chip may be inserted between the leads 61 and the die pad 63 of the lead frame 60 in the same manner as in EXAMPLE 2.

Where a mold is used which includes top and bottom mold halves 24 and 25 configured such that portions of the frame selvages 65a at a lower elevation are respectively aligned with opposite edges of a resin-encapsulated body to be obtained, the resin-encapsulated body molded by such mold has resin flash 66 adjacent the bent portions of the frame selvages 65a as shown in FIG. 22. This is because the configuration of the frame selvages 65a of the lead frame 60 is not congruent with that of the resulting resin-encapsulated body. Therefore, resin is filled in a gap formed between the top and bottom mold halves 24 and 25 around the bent portions of the frame selvages 65a. This makes a difference between EXAMPLE 1 and EXAMPLE 2.

If poor appearance of the resulting product due to the resin flash 66 is critical, the resin flash 67 may be removed along with the resin flash 67 formed between the tie bars 62 and the resin-encapsulated body. Alternatively, the generation of the resin flash 66 can be prevented by modifying the configurations of the fringes of the top and bottom mold halves.

Thereafter, the resulting resin-encapsulated body is subjected to plating of the surfaces of the leads 11, marking, and trimming and forming of the leads 11 in the same manner as in EXAMPLE 1. Thus, a resin-encapsulated semiconductor device as shown in FIG. 17 is completed.

Although the resin-encapsulated semiconductor device shown in FIG. 17 has a configuration different from that of FIG. 7 fabricated in EXAMPLE 1, the configuration difference does not impose any problem on the appearance and function of the semiconductor device.

EXAMPLE 5 (conventional one-piece lead frame)

A lead frame having the same configuration as in EXAMPLE 4 is used for the fabrication of a resin-encapsulated semiconductor device. The resin-encapsulated semiconductor device is fabricated in substantially the same manner as in EXAMPLE 4, except that a semiconductor chip is first fixed on the die pad 63 of the lead frame 60a shown in FIG. 18 and then the lead frame 60 is transformed as shown in FIG. 19 by press-working portions of the frame selvages 15a of the lead frame 60a.

The first lead frame according to the present invention includes a die pad, a plurality of leads, at least two support bars, tie bars and frame selvages which are all integrally formed into one-piece. Therefore, the cost of the lead frame can be reduced in comparison with a conventional plural-piece lead frame. An elevation difference corresponding to the thickness of a semiconductor chip plus a small amount of clearance is made between the die pad and the leads by stretching the support bars for transformation of the lead frame. Therefore, the lead frame does not require a process step of joining plural lead frames, but can be used without any preliminary process. Thus, the production cost can be reduced.

The second lead frame according to the present invention is transformed only by bending frame selvages and, as required, support bars thereof. Therefore, a semiconductor chip can be horizontally inserted between a die pad and leads of the lead frame so as to be mounted on the die pad.

The resin-encapsulated semiconductor devices according to the present invention are fabricated by using the aforesaid lead frames. The use of the aforesaid lead frames enables the use of a less expensive die bond adhesive, unlike a conventional lead frame which requires a relatively expensive adhesive tape. Therefore, the cost can be reduced and, at the same time, the semiconductor devices ensure enhanced reliability in the mounting thereof.

In the process for fabricating a resin-encapsulated semiconductor device, a one-piece lead frame can be readily transformed into a predetermined configuration, and a semiconductor chip can be mounted on a die pad of the lead frame simply by inserting the semiconductor chip parallel to the lead frame between the die pad and leads. Further, a less expensive die bond adhesive can be used to firmly fix the semiconductor chip on the die pad. Therefore, the fabrication of the resin-encapsulated semiconductor device requires simplified process steps and a shorter process time, thereby reducing the production cost.

The mold for use in the fabrication process for a resin-encapsulated semiconductor device according to the present invention is particularly suitable for the fabrication process using the aforesaid lead frames.

Thus, the present invention provides lead frames, resin-encapsulated semiconductor devices and fabrication processes therefor, and a mold for use in the fabrication processes, which can minimize the process steps, process time and cost required for the fabrication of semiconductor devices.

While the present invention has been described by way of specific examples thereof, it should be understood that the examples are merely illustrative of the present invention but not limitative of the same. The spirit and scope of the present invention are to be limited only by the appended claims.

What is claimed is:

1. A lead frame for use in the fabrication of a resin-encapsulated semiconductor device of a lead-on-chip (LOC) structure, comprising:

a die pad for mounting a semiconductor chip thereon;

a plurality of leads having end portions disposed overlapping an area defined by a periphery of the die pad;

at least two support bars supporting the die pad;

tie bars supporting the plurality of leads; and two frame selvages supporting the tie bars, the die pad, the leads, the support bars, the tie bars and the frame selvages being formed from a flexible metal sheet as one piece, wherein at least one of the support bars is connected to one of the tie bars, or connected to one of the frame selvages in a region excluding an orthogonal projection of the die pad but adjacent a connection point between said one of the tie bars and said one of the frame selvages.

2. The lead frame of claim 1, wherein the two support bars each are connected to one of the tie bars, respectively.

3. A lead frame for use in fabrication of a resin-encapsulated semiconductor device of an LOC structure, comprising:

a die pad for mounting a semiconductor chip thereon;

a plurality of leads having end portions located along the periphery of the die pad;

at least two support bars supporting the die pad; and two frame selvages supporting at least one of the support bars, the die pad, the plurality of leads, the support bars and the frame selvages being one piece, wherein the frame selvages each include a narrow portion facing opposite the die pad and a bent portion at a point where a width of the lead frame changes at the narrow portion such that the leads are positioned with a predetermined elevation difference with respect to the die pad and are electrically isolated from the die pad.

4. The lead frame of claim 3, wherein the narrow portions are positioned around connection points between the support bars and the frame selvages, respectively.

5. The lead frame of claim 3, wherein the narrow portion is narrower by about 0.1 mm to 0.9 mm than the rest.

6. A resin-encapsulated semiconductor device of a lead-on-chip (LOC) structure prepared by use of a lead frame comprising a die pad for mounting a semiconductor chip thereon; a plurality of leads having end portions disposed overlapping an area defined by a periphery of the die pad; at least two support bars supporting the die pad; tie bars supporting the plurality of leads; and two frame selvages supporting the tie bars, the die pad, the leads, the support bars, the tie bars and the frame selvages being formed from a flexible metal sheet as one piece, wherein at least one of the support bars is connected to one of the tie bars, or connected to one of the frame selvages in a region excluding an orthogonal projection of the die pad but adjacent a connection point between said one of the tie bars and said one of the frame selvages, wherein the leads are positioned with a predetermined elevation difference with respect to the die pad.

7. A resin-encapsulated semiconductor device of claim 6 comprising:

the die pad;

a semiconductor chip disposed on the die pad and having a plurality of terminals on a surface thereof;

fine metal wires connecting the plurality of terminals of the semiconductor chip to corresponding ones of the leads; and a resin encapsulant encapsulating at least the semiconductor chip, the fine metal wires and end portions of the leads.

8. A resin-encapsulated semiconductor device of claim 6, wherein the predetermined elevation difference corresponds to the thickness of the semiconductor chip plus some clearance.

9. A resin-encapsulated semiconductor device of a lead-on-chip (LOC) structure prepared by use of a lead frame comprising a die pad for mounting a semiconductor chip thereon: a plurality of leads having end portions located along the periphery of the die pad; at least two support bars supporting the die pad; and two frame selvages supporting at least one of the support bars, the die pad, the plurality of leads, the support bars and the frame selvages being one piece, wherein the frame selvages each include a narrow portion facing opposite the die pad and a bent portion at a point where a width of the lead frame changes at the narrow portion such that the leads are positioned with a predetermined elevation difference with respect to the die pad and are electrically isolated from the die pad, and wherein the end portions of the leads are disposed overlapping an area defined by the periphery of the die pad.

10. A resin-encapsulated semiconductor device of claim 9, comprising:

the die pad;

a semiconductor chip disposed on the die pad having a plurality of terminals on a surface thereof;

fine metal wires connecting the plurality of terminals of the semiconductor chip to corresponding ones of the leads; and a resin encapsulant encapsulating at least the semiconductor chip, the fine metal wires and end portions of the leads.

11. A resin-encapsulated semiconductor device of claim 9, wherein the predetermined elevation difference corresponds to the thickness of the semiconductor chip plus some clearance.

* * * * *